United States Patent [19]

Yamazaki et al.

[11] Patent Number: 4,999,693
[45] Date of Patent: Mar. 12, 1991

[54] PHOTOELECTRIC CONVERSION DEVICE WITH A HIGH RESPONSE SPEED

[75] Inventors: Shunpei Yamazaki, Tokyo; Akira Mase; Toshiji Hamatani, both of Atsugi, all of Japan

[73] Assignee: Semiconductor Energy Laboratory Co., Ltd., Atsugi, Japan

[21] Appl. No.: 851

[22] Filed: Jan. 6, 1987

[30] Foreign Application Priority Data

| Jan. 6, 1986 | [JP] | Japan | 61-1008 |
| Jan. 6, 1986 | [JP] | Japan | 61-1009 |
| Mar. 31, 1986 | [JP] | Japan | 61-73746 |

[51] Int. Cl.⁵ .................... H01L 27/14; H01L 31/06
[52] U.S. Cl. ........................... 357/30; 357/2; 357/68; 357/71; 357/32; 357/4; 250/578
[58] Field of Search .............. 357/2, 4, 68, 71, 30 Q, 357/32, 30; 250/578

[56] References Cited

U.S. PATENT DOCUMENTS

| 4,062,038 | 12/1977 | Cuomo | 357/60 |
| 4,405,915 | 9/1983 | Komatsu et al. | 357/30 |
| 4,446,364 | 5/1984 | Hayashi et al. | 250/578 |
| 4,541,015 | 9/1985 | Itoh et al. | 250/578 |
| 4,567,374 | 1/1986 | Takenouchi et al. | 357/2 |
| 4,608,749 | 9/1986 | Harada et al. | 357/30 |
| 4,672,221 | 6/1987 | Saito et al. | 250/578 |
| 4,677,742 | 7/1987 | Johnson | 357/2 |
| 4,678,542 | 7/1987 | Boer et al. | 357/65 |
| 4,740,710 | 4/1988 | Arita | 357/30 |
| 4,754,152 | 6/1988 | Hayama et al. | 357/2 |

FOREIGN PATENT DOCUMENTS

| 57-106083 | 7/1982 | Japan | 357/2 |
| 57-211787 | 12/1982 | Japan | 357/4 |
| 59-43568 | 3/1984 | Japan | 357/30 |
| 60-47473 | 3/1985 | Japan | 357/2 |

*Primary Examiner*—Jerome Jackson, Jr.
*Attorney, Agent, or Firm*—Sixbey, Friedman, Leedom & Ferguson

[57] ABSTRACT

An improved photoelectric conversion device is shown. The device includes a plurality of photoelectric semiconductor elements each of which are composed of a first electrode and a semiconductor layer and a second electrode. The opposed surfaces of semiconductor layer is completely covered by the first and second electrodes.

15 Claims, 14 Drawing Sheets

PHOTOELECTRIC CONVERSION DEVICE WITH A HIGH RESPONSE SPEED

BACKGROUND OF THE INVENTION

The present invention relates to a photoelectric conversion device.

Figure 1A:
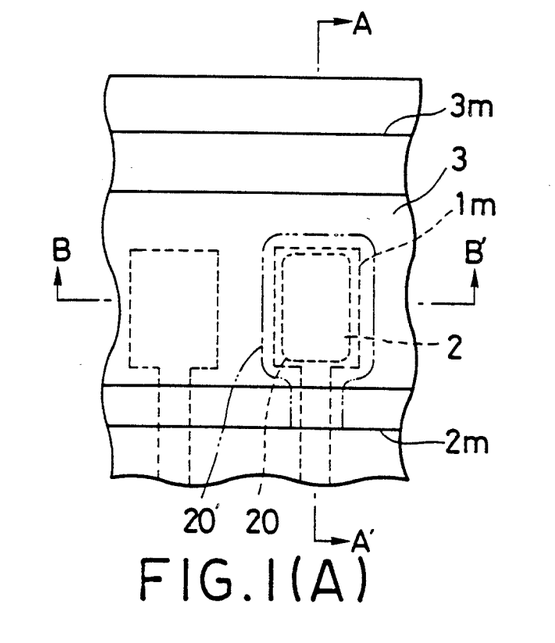
Figure 1B:
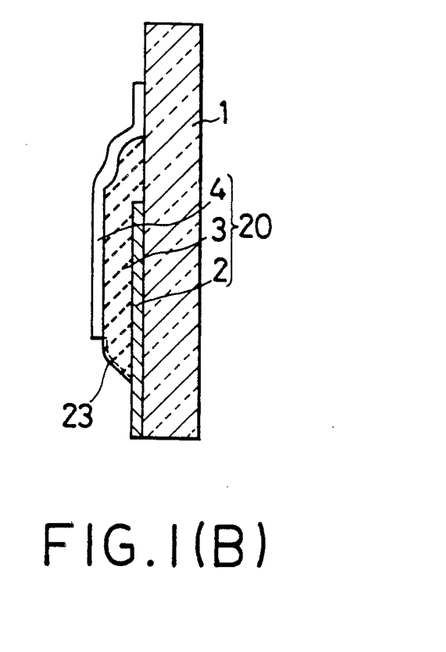
Figure 1C:
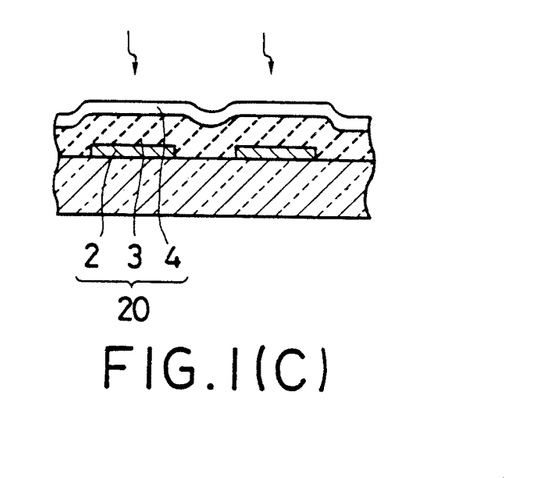

Heretofore a variety of applications of photoelectric conversion devices have been proposed. As an example of such an application, a contact image sensor for a facsimile machine is schematically illustrated in FIG. 1. The sensor is comprised of a photosensitive semiconductor layer 3 provided with a pair of electrodes 2 and 4 on the opposed surfaces, which are fabricated by a lithography using three masks.

The fabrication method of this prior device is as follows. First, a conductive layer of chromium is formed on a substrate 1 and is then patterned with a first mask 1m to form a plurality of first electrodes 2. Over the patterned electrode 2, a photosenstive intrinsic semiconductor layer of amorphous silicon is deposited to a thickness of 1 micrometer by a glow discharge method which is then patterned with a second mask 2m of a metal to form a photoelectric conversion layer 3. As the semiconductor layer 3, the amorphous silicon layer is formed in such a way that the patterned layer covers the first electrode 2 sufficiently even with a possible displacement of the mask 2m. Then, a conductive layer of tin indium oxide is formed on the semiconductor layer 3 and patterned with a third mask 3m to form a second electrode 4. A rectifying diode can be formed from a junction (MI junction) between the second electrode 4 and the semiconductor layer 3, a Schottky barrier.

When light is incident on the semiconductor layer 3 through the second electrode 4 as shown in FIG. 1(C), electron-hole pairs are generated in proportion to the intensity of the incident light.

The image sensor shown in FIGS. 1(A) to 1(C), however, is constructed with the semiconductor layer 3 larger than the first electrodes 2. Because of this, there are generated electron-hole pairs also in the region that is disposed vertically between the opposed electrodes 2 and 4 and lateral drifts of the carriers generated in the region take place as shown in FIG. 1(A) and FIG. 1(B) by arrows. The lateral drift imparts a lag to the response.

On the other hand, the intrinsic semiconductor layer fabricated as in the above tends to form a parasitic channel on an exposed surface thereof which is easily transformed into an n-type, causing a large dark current which diminishes the quality of the products. Further, the use of three masks increases the cost of manufacturing and reduces performance.

SUMMARY OF THE INVENTION

It is therefore an object of the invention to provide improved photoelectric conversion devices and methods for manufacturing the same.

It is another object of the invention to provide improved photoelectric conversion devices and methods for manufacturing the same capability of converting incident light at the real time.

It is a further object of the invention to provide improved photoelectric conversion devices and methods for manufacturing the same in which little time lag occurs in response to incident light.

It is yet a further object of the invention to provide improved photoelectric conversion devices and methods for manufacturing the same with few parasitic channels.

BRIEF DESCRIPTION OF THE DRAWINGS

FIGS. (A), (B) and (C) show a prior art image sensor;

FIGS. 3(A) through 3(C) are plan views and sectional views showing another linear contact image sensor in accordance with the present invention;

FIGS. 4(A) through 4(F) are plan views and sectional views showing a further linear contact image sensor in accordance with the present invention;

FIGS. 5(A) through 5(G) are plan views and sectional views showing a still further contact image sensor in accordance with the present invention; and FIGS. 6(A) through 6(M) are plan views and sectional views showing a two-dimensional contact image sensor in accordance with the present invention.

DETAILED DESCRIPTION OF THE PREFERRED EMBODIMENT

Referring to FIGS. 2(A) to 2(M), an embodiment of the invention is illustrated according to the manufacturing process thereof.

Figure 2A:
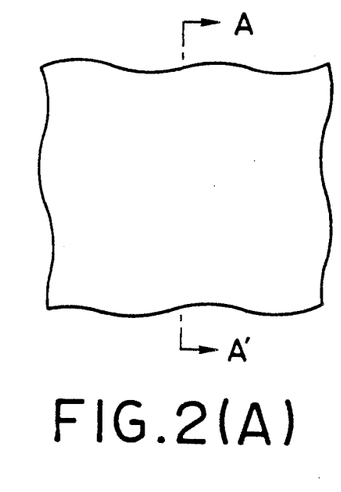
FIGS. 2(A), through 2(M) are plan views and sectional views showing a linear contact image sensor in accordance with the present invention.
Figure 2B:
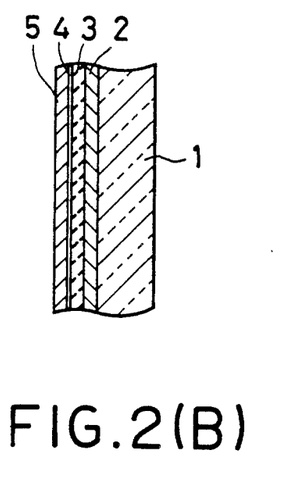

On a heat resisting transparent substrate 1 such as a quartz plate or a pyrex plate, a first conductive layer 2, a photosensitive semiconductor layer 3, and a second conductive layer 5 are formed in sequence. The first conductive layer 2 is a tin indium oxide layer with a thickness of 2000 Å. The semiconductor layer 3 is composed of at least a substantially intrinsic semiconductor layer, such as an amorphous silicon semiconductor layer incorporating a p-i-n, n-i-n or m-i junction therein, and deposited by a known chemical vapor deposition (CVD) system. The silicon semiconductor layer apparently has a slight n-type conductivity, so that it may be doped with such a p-type impurity as boron to make the semiconductor substantially intrinsic.

For instance, the semiconductor layer is composed of a 200 Å thick p-type semiconductor layer, a 3500 Å thick intrinsic semiconductor layer and a 300 Å thick n-type semiconductor layer, which are deposited by a multi-chamber plasma enhanced CVD system (as disclosed in Japanese patent application No. sho 54-104452 by the applicant). In this case, the second conductive layer 5 is formed of chromium with a thickness of 1000 Å, and a transparent conductive layer 4 of chromium silicide is formed as a by-product with a thickness of 10 to 200 Å between the semiconductor layer 3 and the chromium layer 5. The chromium silicide layer 4 provides an ohmic contact between the semiconductor layer 3 and the electrode 5 as a buffer layer.

A reverse bias voltage is applied across the laminate layers to cure the defects in the semiconductor layer 3. Namely, the first conductive layer 2 is connected with the positive electrode of a voltage supply and the second conductive layer 4 is connected with the negative electrode of the voltage supply and the applied voltage is gradually increased. In this process, the current passing through the semiconductor layer is increased with overlapping irregular transient currents as the applied voltage increases. However, the passing current is suddenly decreased when the applied voltage reaches 3 to 5 V and is stabilized at the level which corresponds to the specific resistance of the semiconductor when the reverse bias voltage increases to 10 V. The phenomenon can be explained as follows: defects have resistivities substantially smaller than a normal portion of the semiconductor layer and the current flow passing therethrough accounts for the transient currents, and more precisely, the defects are recognized adversely therefor. The currents across the defects are spacially limited and made intensive, so that the heat produced by the current burns the defects and makes insulating the same. The applied voltage, of course, must be lower than the breakdown voltage of the semiconductor layer 3.

Figure 2C:
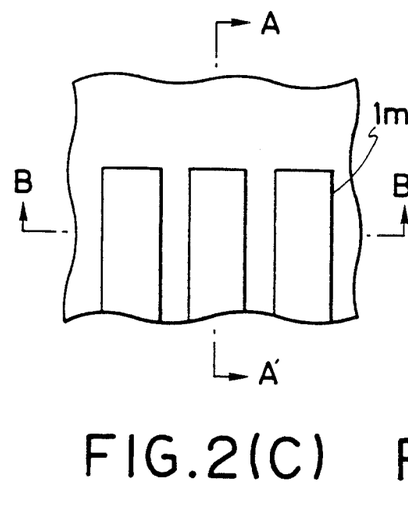
Figure 2D:
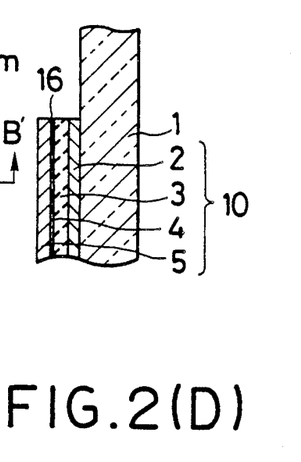
Figure 2E:
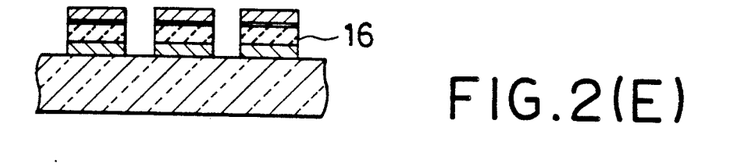

Next, the laminate layers of the conductive layers 2, 4 and 5 and the semiconductor layer 3 are integrally etched by means of a first mask 1m to produce a plurality of extending laminate members 10 as shown in FIGS. 2(C), (D) and (E).

The laminate members 10 are thus formed in a linear array wherein each element is 100 micrometers wide and 150 micrometers long with an interval of 30 micrometers.

Figure 2F:
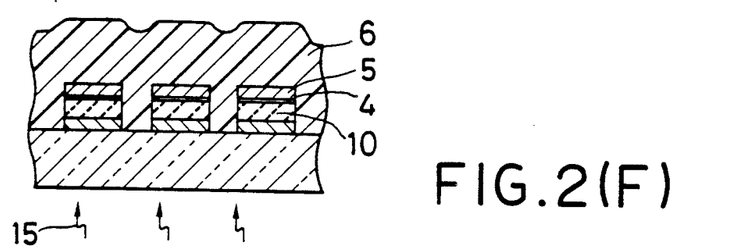

As shown in FIG. 2(F), a photocurable organic resin layer 6, e.g. an aromatic polyimide precursor solution, is formed with 1.6 micrometers in thickness by a coating method so as to completely enclose the cell members 10. The, the transparent substrate 1 is pre-baked in a clean oven at 80° C. for and irradiated from the back surface thereof with ultraviolet light by a known mask aligner without using a mask. The irradiation time is about two minutes when an aligner is used such as one distributed from Cobilt Company. After curing, the uncured portion of the resin layer is removed using a suitable rinsing liquid so that the remaining resin layer and the transparent conductive layer 4 are of the same height. In this connection, the curing treatment reduces the volume of the resin approximately by a factor of 2, so that the thickness of the resin layer before curing is chosen about 1.6 micrometers for the members with a thickness of 0.8 micrometer. Using ultraviolet light having 300 to 400 nm wavelengths (10 mW/cm$^2$, the irradiation time is sufficient at 15 to 30 seconds.

Figure 2G:
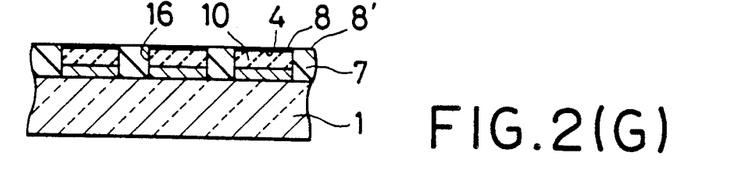

After the etching, the substrate 1 is heated in a nitrogen atmosphere at 180° C. for 30 minutes, at 300° C. for 30 minutes and at 400° C. for 30 minutes. Next, the chromium layer 5 is removed by a known etching solution and the transparent chromium silicide layer 4 remains alone on the semiconductor 3 (see FIG. 2(G)). The chromium silicide layer 4 prevents an indium tin oxide (ITO) layer, when formed on the semiconductor layer 3 in the subsequent step from degradation caused by interaction between the semiconductor layer and the ITO layer.

Figure 2H:
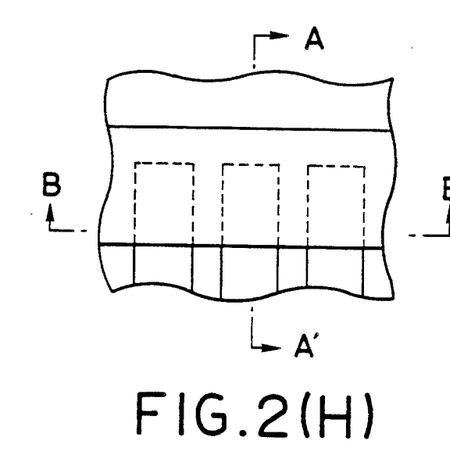
Figure 2I:
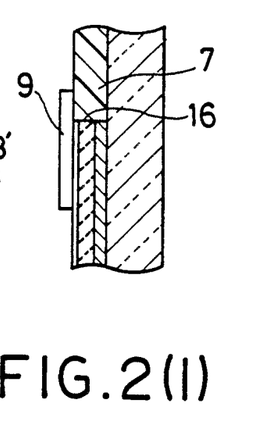
Figure 2J:
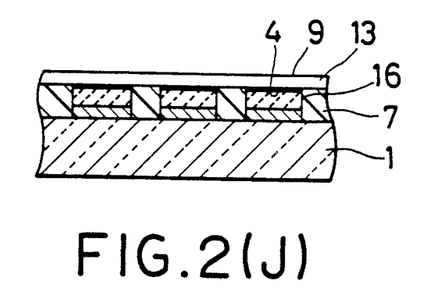
Figure 2K:
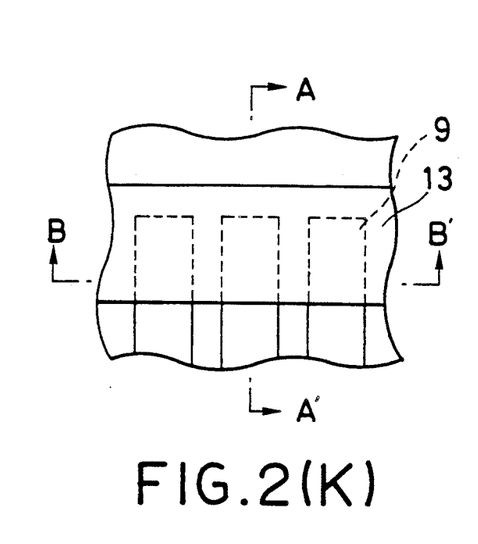
Figure 2L:
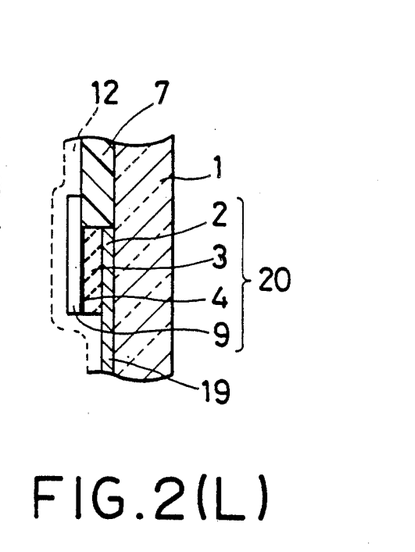

Then, as shown in FIGS. 2(H), 2(I) and 2(J), a transparent electrode made of tin oxide is formed with 0.1 to 0.5 micrometer in thicknessover the extending ends of the laminate members 10, and is selectively etched with a second photomask 2m. With the transparent electrode 9 as a mask, the semiconductor layer 3 is etched together with the chromium silicide layer 4, remaining the part of the same that is only behind the electrode 9. Finally, the upper surface of the device is coated with a resin layer 12 as shown in FIGS. 2(L) and (M). Then, the manufacturing of an image sensor with a smooth top surface is completed. For example, the elements can be aligned 8 cells per 1 mm in a line.

The device has been examined in the vicinity of the contact between the elements and the resin layer by an electron microscope in advance of forming the electrode 9. As a result, a slight unevenness was observed but no cracks, which tend to cause a short current between the opposed electrodes 2 and 4 by drawing the material of the electrode 2 or 4. Also, there were no projections observed which might lead to a disconnection of the patterns arranged thereon, and the two laterally adjacent layers were recognized as smoothly connected with each other. By virtue of this configuration, it becomes possible to superimpose an ITO (indium tin oxide) layer as the electrode 9 on the layers without causing any possibility of disconnection at the position just above the interface.

Figure 2M:
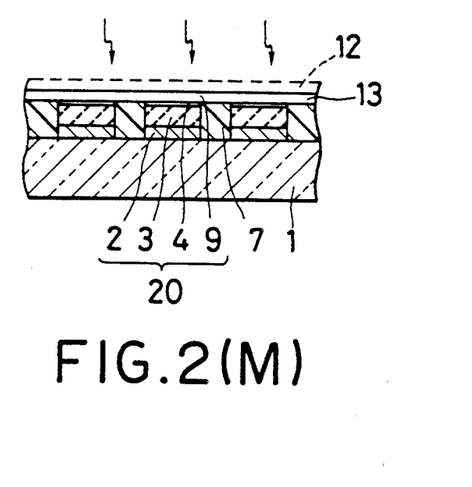

The photoelectric conversion element 20 thus formed is comprised of the first electrode 2 in conect with the line 19, the semiconductor layer 3, the second electrode 4 and the third electrode 5 in contact with the line 13. And the semiconductor layer 3 is completely enclosed with the electrodes at the top and bottom surfaces and the resin layers at the side surfaces so that no current leakage and no parasitic channel takes place on the semiconductor layer.

Further, the opposed electrodes 2 and 4 can be opposed to each other through the semiconductor layer 3 which has the same area and the same shape as the electrodes 4 and 5 regardless of the precision of the patterning.

An example of the photoelectric characteristics obtained by an experiment using a photoelectric device with p-i-n junctions according to the invention will be described hereinbelow. The dark current with an applied voltage of 3 V is $1.8 \times 10^{-13}$ A (the cell area; 100 microns $\times$ 150 microns) and the photo current with an irradiation of 100 Lx is $3.5 \times 10^{-8}$ A. The response characteristic of the device was such that incident light switching over per one microsecond could be followed up. A prior art device as described above could not follow up such a frequent change.

Another experiment was made for a photelectric device incorporating n-i-n junctions therein. Characteristics of the current passing through the junction versus the applied bias is symmetrical about the zero bias. The dark current was $4 \times 10^{-13}$ A and the photo conductivity with reference light of 100 Lx. The device could follow satisfactorily up an intermittent irradiation at intervals of 0.2 microsecond.

Figure 3A:
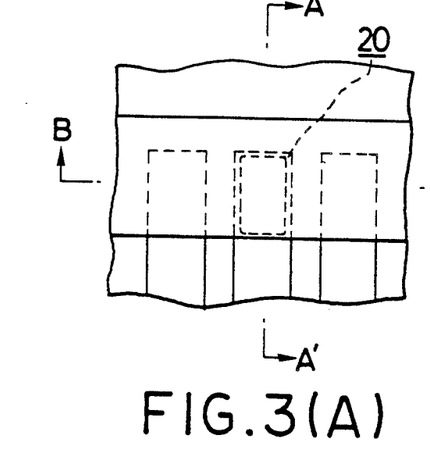
Figure 3B:
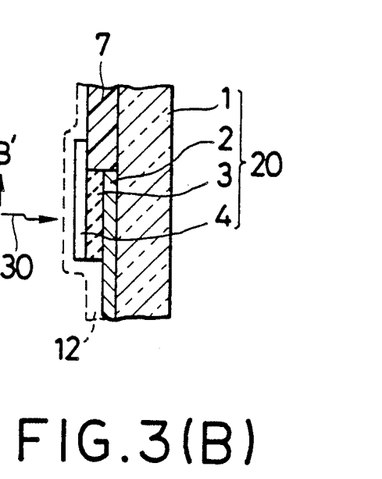
Figure 3C:
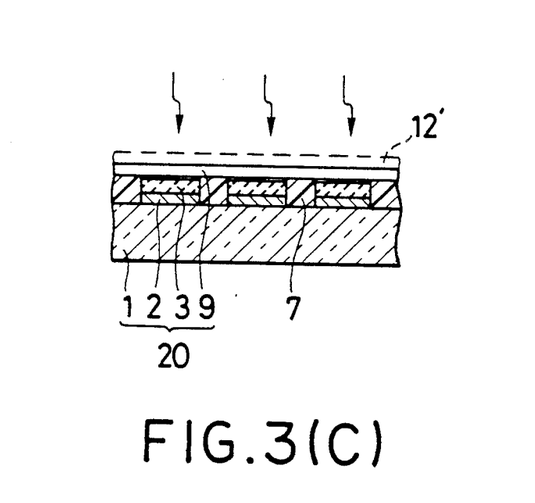

FIGS. 3(A) through 3(C) shows another linear contact image sensor in accordance with the present invention. In this embodiment the formation of the chromium silicide layer 4 is dispensed with; however, the other processing and configurations are the same as the foregoing embodiment so that a redundant description is unnecessary; namely, the chromium layer 5 is not formed.

The above embodiments pertain to linear contact image sensors in which the outer electrodes thereof are designed larger than the corresponding semiconductor regions. By virtue of this configuration, no side drifts of carriers and no response lag takes place.

FIGS. 4(A) through 4(F) illustrate a further linear image sensor according to the invention in which the upper electrode is formed coincident with the semiconductor layer in one direction. The process for this embodiment is the same as that of the former embodiment through the steps shown in FIGS. 2(A) through 2(G), therefore the same description is not repeated.

Figure 4A:
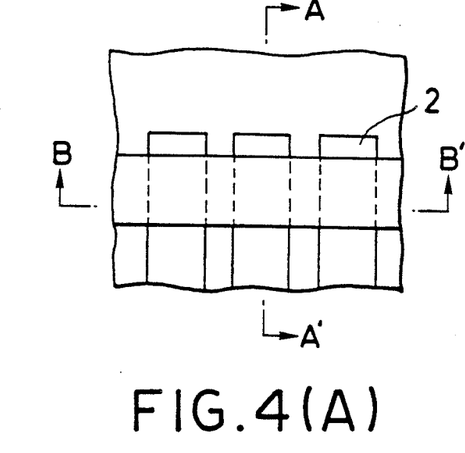
Figure 4B:
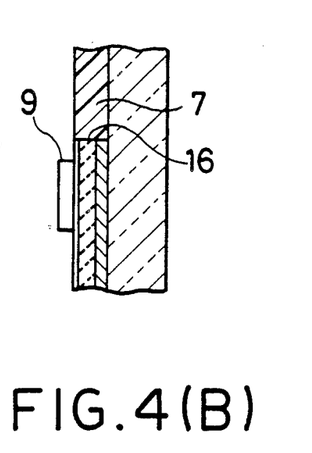
Figure 4C:
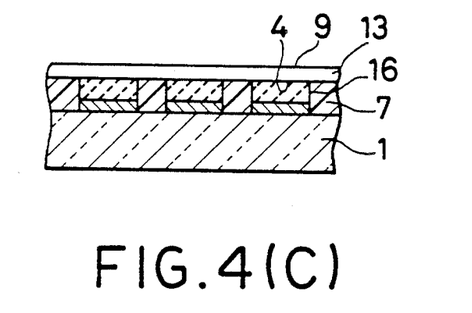
Figure 4D:
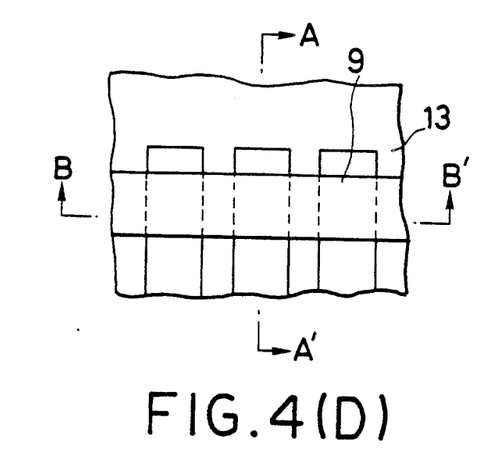
Figure 4E:
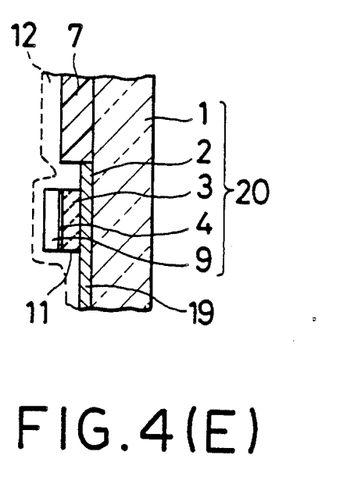
Figure 4F:
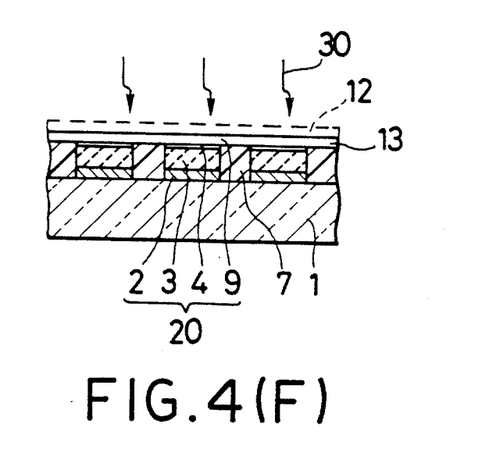

Referring to FIGS. 4(A) through 4(F), a transparent electrode made of tin oxide is formed with a thickness of 0.1 to 0.5 micrometer and is selectively etched with a second photomask 2m in such a way that the ends of the members extend beyond the third electrode 9. With the transparent electrode 9 as a mask, the semiconductor layer 3 is etched together with the chromium silicide layer 4, remaining the portions of the semiconductor layer just behind the electrode 9. Thus, photosensitive elements 2 are formed with the outer electroes 9 which are coincident with the remaining semiconductor layers in the lateral direction. Finally, the upper surface of the device is coated with a resin layer 12 as shown in FIGS. 4(E) and 4(F). Then, the manufacturing of an image sensor having an array of photoconductive elements is completed. For example, the elements can be aligned eight cells per 1 mm in a line.

FIGS. 5(A) through 5(G) show a still further linear contact image sensor according to the invention. The sensor has its substrate 1 providing the light receiving surface. The processing of the embodiment is the same as the former embodiment up to the step in FIG. 2(F). Therefore, a redundant description is unnecessary.

Figure 5A:
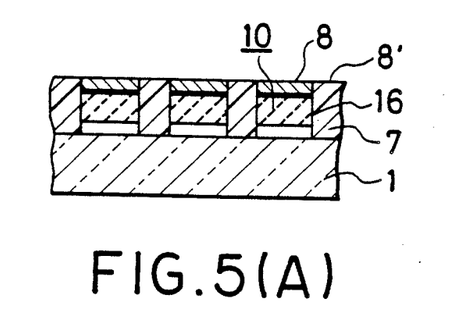
Figure 5B:
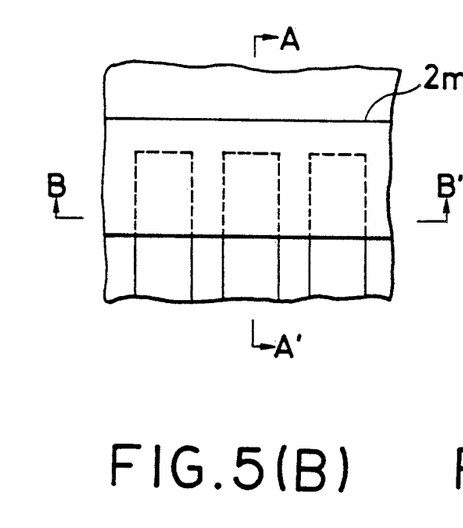
Figure 5C:
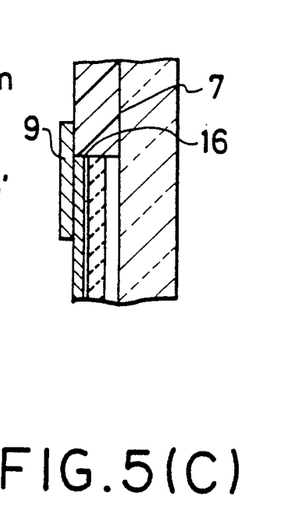
Figure 5D:
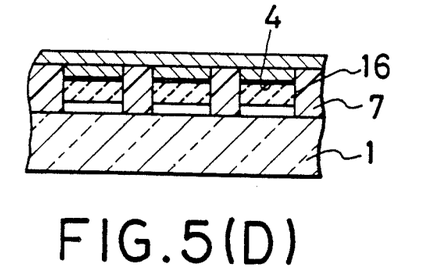
Figure 5E:
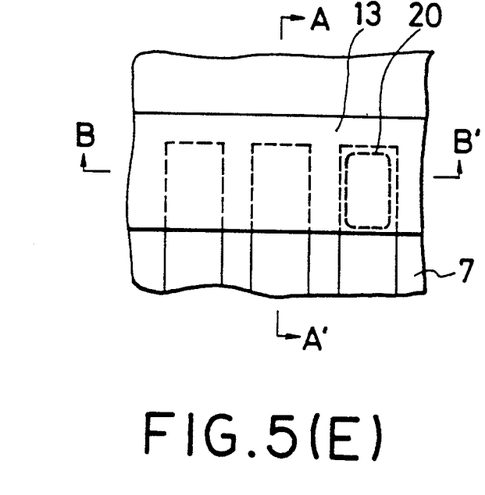
Figure 5F:
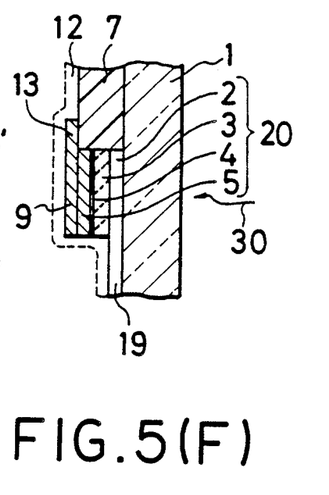
Figure 5G:
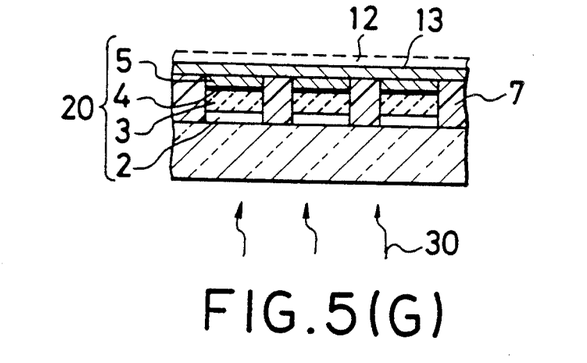

After depositing the resin layer 6 as shown in FIG. 2(E), the substrate 1 is irrradiated with light from the bottom surface in such a degree as not to cure the upper portion of the resin layer which is located above the upper surface of the chromium layer as shown in FIG. 5(A). Then, the substrate 1 is heated in a nitrogen atmosphere at 180° C. for 30 minutes, at 300° C. for 30 minutes and at 400° C. for 30 minutes. Then, as shown in FIGS. 5(B), 5(C) and 5(D), an electrode strip is formed with a thickness of 0.1 to 0.5 micrometer over the extending ends of the laminate members 10, and is selectively etched with a second photomask 2m. With the transparent electrode 9 as a mask, the semiconductor layer 3 is etched together with the electrode 5 and the chromium silicide layer 4, remaiining the part of the same that is behind the electrode 9. Finally, the upper surface of the device is coated with a resin layer 12 as shown in FIGS. 5(F) and (G). Then, the manufacturing of an image sensor with a smooth top surface is completed. For example, the photosensitive elements can be aligned eight cells per 1 mm in a line.

Referring to FIGS. 6(A) through 6(M), a two-dimensional image sensor of the invention is illustrated according to the manufacturing process.

Figure 6A:
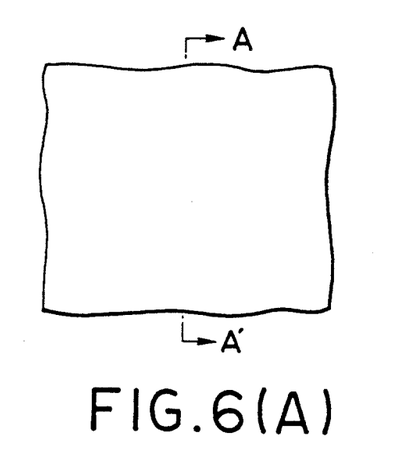
Figure 6B:
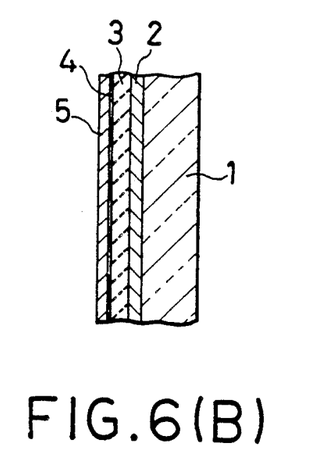

On a heat resisting transparent substrate 1 such as a quartz plate or a pyrex glass plate, a first conductive layer 2, a photosensitive semiconductor layer 3, and a second conductive layer 5 are formed in sequence. The first conductive layer is a tin indium oxide layer with a thickness of 2000 Å. The semiconductor layer is composed of at least a substantially intrinsic semiconductor layer, such as an amorphous silicon semiconductor layer incorporating a p-i-n, n-i-n or m-i junction therein, and deposited by a known CVD system. The silicon semiconductor layer apparently has a slight n-type conductivity, so that it may be doped with such a p-type impurity as boron to make the semiconductor substantially intrinsic.

For instance, the semiconductor layer is composed of a 200 Å thick p-type semiconductor layer, a 3500 Å thick intrinsic semiconductor layer and a 300 Å thick n-type semiconductor layer, which are deposited by a multi-chamber plasma enhanced CVD system (as disclosed in Japanese patent application). In this case, the second conductive layer 5 is formed of chromium with a thickness of 1000 Å and a transparent conductive layer 4 of chromium silicide is formed as a by-product with a thickness of 10 to 200 Å between the semiconductor layer 3 and the electrode 5 as a buffer layer.

A reverse bias voltage across the laminate layers is applied to cure the defects in the semiconductor layer 3. Namely, the first conductive layer 2 is connected with the positive electrode of a voltage supply and the second conductive layer 4 is connected with the negative electrode of voltage supply and the applied voltage is gradually increased. In this process, the current passing the semiconductor layer is increased with overlapped irregular transient currents as the applied voltage increases. However, the passing current is suddenly decreased when the applied voltage reaches 3 to 5 V and is stabilized at the level which corresponds to the specific resistance of the semiconductor when the reverse bias voltage increases to 10 V. The phenomenon can be explained as follows: defects have resistivities substantially smaller than a normal portion of the semiconductor layer and the current flow passing therethrough accounts for the current, and the defects are recognized adverse therefore. The currents across the defects are spacially limited and made intensive, so that the heat produced by the current burns the defects and makes the same insulating. The applied voltage, of coure, must be lower than the breakdown voltage of the semiconductor layer 3.

Figure 6C:
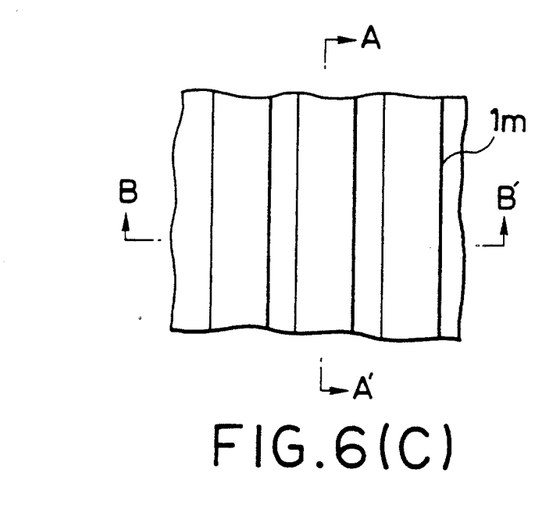
Figure 6D:
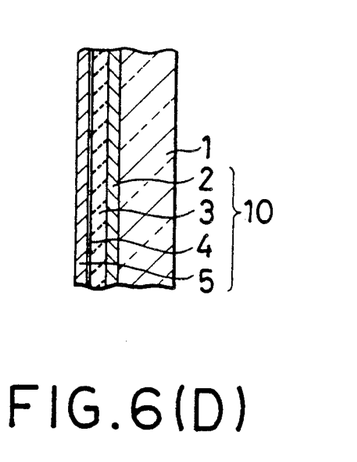
Figure 6E:
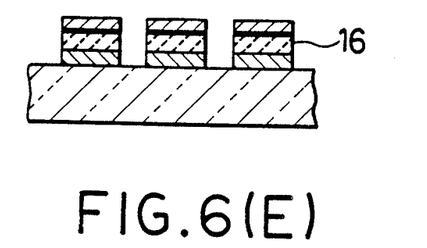

Next, the laminate layers of the conductive layers 2, 4 and 5 and the semiconductor layer 3 are integrally etched by means of a first mask 1m to produce a plurality of extending laminate members 10 as shown in FIGS. 6(C), 6(D) and 6(E).

The laminate members 10 are thus formed in a striped arrangement to constitute the sensitive portions of the contact image sensor and are designed in the form of a matrix composed of elements 100 micrometers wide and 150 micrometers long with an interval of 30 micrometers.

Figure 6F:
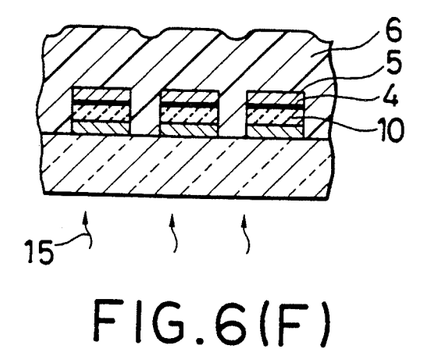

As shown in FIG. 6(F), a photocurable organic resin layer 6, e.g. an aromatic polyimide precursor solution, is formed with a thickness of 1.6 micrometers by a coating method so as to completely enclose the cell members 10. Then, the transparent substrate 1 is pre-baked in clean oven at 80° C. for an hour and irradiated from the back surface thereof with ultraviolet light by a known mask aligner without using a mask. The irradiation time is about two minutes when an aligner distributed from Cobilt Co. is used. After curing, the uncured portion of the resign layer is removed using a suitable rinsing liquid so that the uncured portion of the resin layer is removed using a suitable rinsing liquid so that the remaining resin layer 6 and the transparent conductive layer 4 ar of the same height. In this connection, the curing treatment reduces the volume of the resin approximately by a factor of 2, so that the thickness of the resin layer before curing is chosen about 1.6 micrometers for the photosenitive elements with a thickness of 0.8 micrometer. With ultraviolet light having 300 to 400 nm wavelengths (10 mW/cm$^2$), the irradiation time is sufficient at 15 to 30 seconds.

Figure 6G:
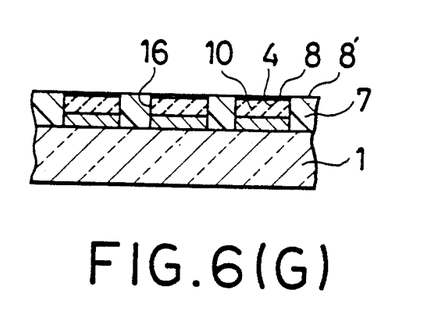

After the etching, the substrate 1 is heated in a nitrogen atmosphere at 180° C. for 30 minutes, 300° C. for 30 minutes and at 400° C. for 30 minutes. Then, the chromium layer 5 is removed by a known etching solution and the transparent chromium silicide layer 4 remains alone on the semiconductor 3 (see FIG. 6(G)). The chromium silicide layer 4 prevent an idium tin oxide (ITO) layer, when formed on the semiconductor layer 3 in the subsequent step, from degradation caused by interaction between the semiconductor layer and the ITO layer.

Figure 6H:
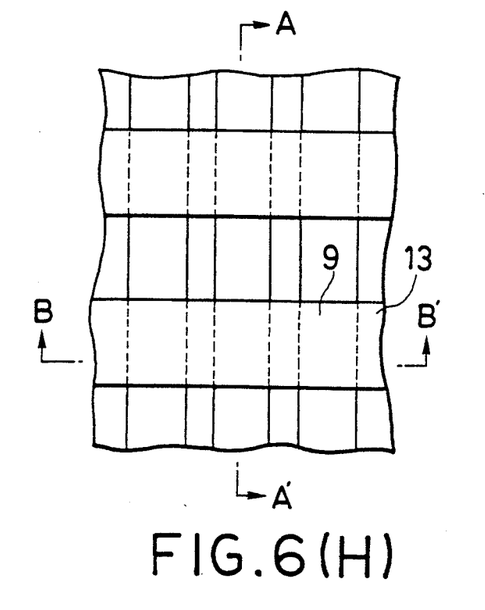
Figure 6I:
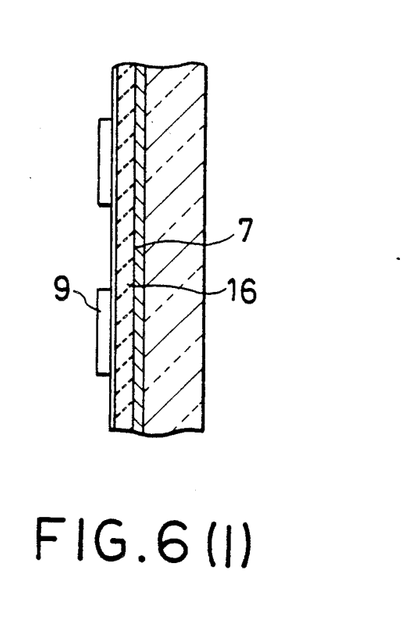
Figure 6J:
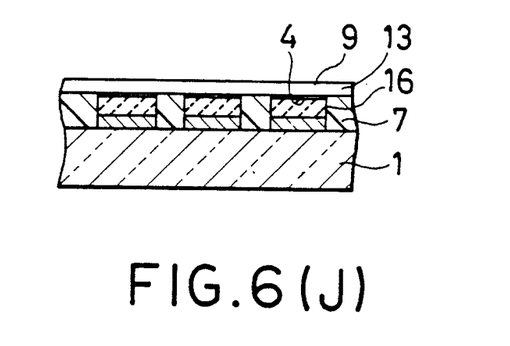
Figure 6K:
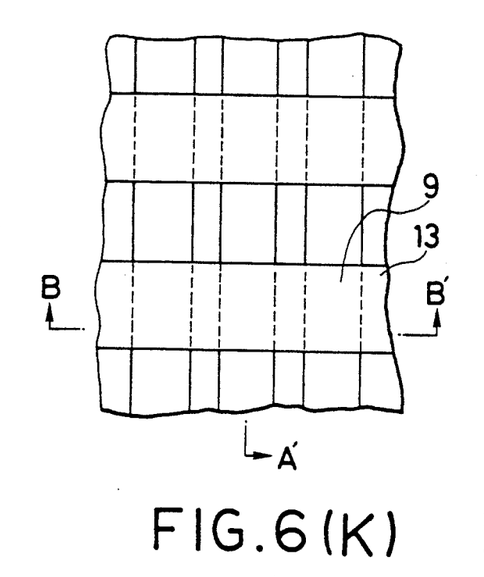
Figure 6L:
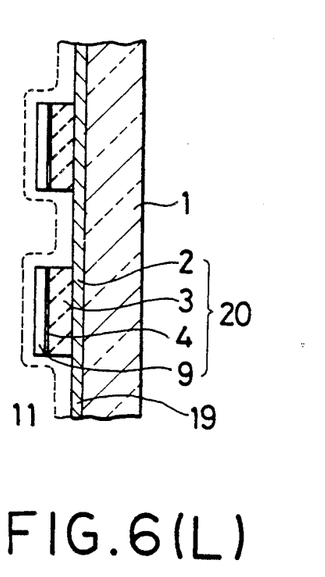
Figure 6M:
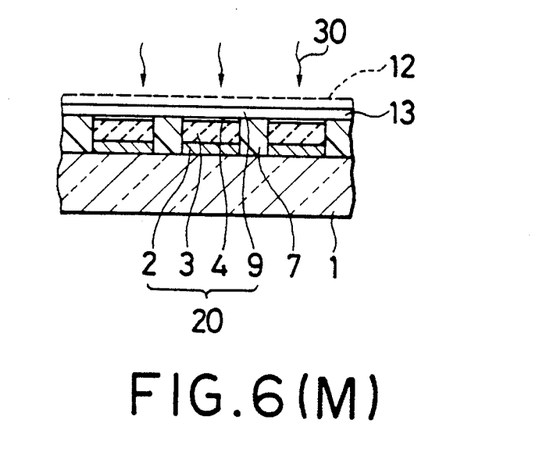

Then, as shown in FIGS. 6(H), 6(I) and 6(J), a transparent electrode 9 made of tin oxide is formed throughout the upper surface of the substrate with a thickness of 0.1 to 0.5 micrometer which is then selectively etched with a second photomask 2m to produce a plurality of electrode strips extending perpendicular to the laminate members 10. With the transparent electrode 9 as a mask, the semiconductor layer 3 is etched together with the chromium silicide layer 4, remaining the part of the same that is behind the electrode 9. Finally the upper surface fo the device is coated with a resin layer 12 as shown in FIGS. 6(L) and 6(M). Then, the manufacturing of an image sensor with a smooth top surface is completed.

The photoelectric semiconductor element 20 thus formed is comprised of the first electrode 2 in contact with the line 19, the semiconductor layer 3, the second electrode 4 and the third electrode 5 in contact with the line 13. And, the semiconductor layer 3 is completely enclosed with the electrodes at the top and bottom surfaces and the resin layers at the side surfaces so that no current leakage and no parasitic channel takes place on the semiconductor layer.

Further, the opposed electrodes 2 and 4 can be opposed to each other through the semiconductor layer 3 which has the same area and the same shape as the electrodes 4 and 5 regardlness of the precision of the patterning.

As described in the above, a device according to the present invention is comprised of laminate layers whose peripheries are surrounded respectively by a resin layer. However, the upper surface of the layer is exposed as if the resin layer was not provided. Although the surfaces of the layer and the resin layer are configured preferably flush with each other, the resin layer may be formed with its upper surface positioned lower than that of the member.

The present invention is useful especially for an image sensor because a number of sensor elements can be finely disposed on a substrate without causing cross-talking between adjacent ones and because the sensor elements maintain high reliability for a long time and have a high abrasion resistance against external impacts.

It should be understood that the present invention is not limited to the specified embodiments described but only to the appending claims, and a variety of modifications and changes of the embodiments may occur to those skilled in the art.

Although the embodiments have been described as to contact image sensors, the present invention can be applied also to photoelectric conversion devices of other types which have only one conversion element or a few conversion elements. A photoelectric conversion semiconductor layer can incorporate p-i, n-i, m-i (Schotky contact), n-i-p or m-i-n junctions, besides p-i-n or n-i-n junctions. The semiconductor substance to be used for the invention may be $Si_xGe_{1-x}(0<x-\leqq 1)$, $Si_xC_{1-x}(0<x\leqq 1)$ or $Si_xSn_{1-x}(0<x\leqq 1)$.

What is claimed is:

1. A photosensor array comprising:
   a plurality of first electrodes;
   a plurality of photosensitive blocks having first and second opposed surfaces, said blocks being arranged in an array formed respectively at said first electrodes such that said first surfaces of the photosensitive blocks respectively contact the first electrodes;
   an organic insulating material provided filling the spaces between said photosensitive blocks in order to form a first surface of the organic insulating material flush with the second surfaces of said photosensitive blocks; and
   a common electrode formed adjacent the first surface of said organic insulating material and said second surface of the photosensitive blocks in order that each photosensitive block constitutes an independent photosensor operative with a corresponding one of said first electrodes and said common electrode.

2. The sensor of claim 1 wherein said common electrode is made of chromium.

3. The sensor of claim 2 wherein said photosensitive blocks are made of silicon.

4. The sensor of claim 3 further comprising a chromium silicide layer which has been formed from an interaction between said common electrode and said photosensitive blocks.

5. The sensor of claim 1 wherein the organic insulating layer is a resin which is in contact with side boundary surface of said photosensitive blocks.

6. The sensor of claim 5 wherein a plurality of photoelectric conversion devices are arranged on a substrate in the form of a row, each photoelectric conversion device being composed of a photosensitive block and said common electrode and a first electrode.

7. The sensor of claim 2 wherein said first electrode functions also as an output electrode.

8. The sensor of claim 7 wherein said plurality of photoelectric conversion devices share one electrode strip as said common electrode which extends along said row.

9. The sensor of claim 5 wherein a plurality of photoelectric conversion devices are arranged on a substrate in the form of a matrix of rows and columns, each photoelectric conversion device being composed of a photosensitive block and said common electrode and a first electrode.

10. The sensor of claim 9 wherein the photoelectric conversion devices arranged on each row of said matrix share one electrode strip as said first electrode extending along the row while the photoelectric conversion devices arranged on each column of said matrix share one electrode strip extending along the column.

11. The sensor of claim 1 wherein said first electrodes are made transparent to provide an access for incident light to said photosensitive blocks, while said common electrode is opaque.

12. The sensor of claim 1 wherein said first and/or common electrodes are made transparent to provide an access for incident light to said photosensitive blocks.

13. The sensor of claim 1 wherein the contacts between the photosensitive blocks and the common and first electrodes are ohmic.

14. The sensor of claim 13 wherein said photosensitive blocks incorporate n-i-n, or n-i junctions therein.

15. A photosensor as in claim 1 which includes a Schottky junction with the photosensitive blocks.

* * * * *